(12) United States Patent
Huang et al.

(10) Patent No.: US 8,896,021 B2
(45) Date of Patent: Nov. 25, 2014

(54) INTEGRATED CIRCUIT DEVICE

(75) Inventors: Chung-I Huang, Tainan (TW); Pao-An Chang, Taoyuan County (TW); Ming-Tsung Lee, Yilan County (TW)

(73) Assignee: United Microelectronics Corporation, Hsinchu (TW)

( * ) Notice: Subject to any disclaimer, the term of this patent is extended or adjusted under 35 U.S.C. 154(b) by 715 days.

(21) Appl. No.: 13/232,048

(22) Filed: Sep. 14, 2011

(65) Prior Publication Data

US 2013/0062661 A1 Mar. 14, 2013

(51) Int. Cl.
| | |
|---|---|
| *H01L 29/66* | (2006.01) |
| *H01L 27/088* | (2006.01) |
| *H01L 29/78* | (2006.01) |
| *H01L 27/06* | (2006.01) |
| *H01L 29/739* | (2006.01) |
| *H01L 29/06* | (2006.01) |
| *H01L 29/08* | (2006.01) |
| *H01L 29/40* | (2006.01) |

(52) U.S. Cl.
CPC .......... *H01L 27/0623* (2013.01); *H01L 27/088* (2013.01); *H01L 29/0634* (2013.01); *H01L 29/7835* (2013.01); *H01L 29/7393* (2013.01); *H01L 29/0847* (2013.01); *H01L 29/404* (2013.01)
USPC ........... 257/141; 257/258; 257/287; 257/343; 257/355; 257/423; 257/557; 257/566; 257/E29.187; 257/E29.197; 257/E21.382

(58) Field of Classification Search
CPC .............. H01L 29/66; H01L 29/41725; H01L 29/41758; H01L 29/70; H01L 29/73; H01L 29/739; H01L 29/7393; H01L 29/7835; H01L 27/0623; H01L 27/0692
USPC ......... 257/140, 141, 258, 287, 343, 355, 423, 257/557, 566, 575, 611, E29.187, E29.197, 257/E21.382
See application file for complete search history.

(56) References Cited

U.S. PATENT DOCUMENTS

| | | | |
|---|---|---|---|
| 5,378,912 A * | 1/1995 | Pein | 257/335 |
| 6,855,581 B2 | 2/2005 | Roh et al. | |
| 7,465,964 B2 * | 12/2008 | Udrea | 257/122 |
| 7,960,786 B2 * | 6/2011 | Huang et al. | 257/341 |
| 8,278,683 B2 * | 10/2012 | Kawahara et al. | 257/141 |
| 2002/0053717 A1 * | 5/2002 | Sumida | 257/565 |
| 2002/0155646 A1 * | 10/2002 | Petruzzello et al. | 438/149 |
| 2006/0067137 A1 | 3/2006 | Udrea et al. | |
| 2008/0315251 A1 * | 12/2008 | Lee | 257/141 |
| 2012/0161201 A1 * | 6/2012 | Hsieh | 257/140 |

* cited by examiner

*Primary Examiner* — Mamadou Diallo
*Assistant Examiner* — Joannie A Garcia
(74) *Attorney, Agent, or Firm* — WPAT, PC; Justin King

(57) ABSTRACT

An integrated circuit device includes a semiconductor substrate and a first transistor and a second transistor constructed in the semiconductor substrate. The first transistor has a first operating voltage higher than a second operating voltage of a second transistor. The first transistor includes a first drain structure, a first source structure, an isolation structure and a first gate structure. The first source structure includes a high voltage first-polarity well region, a first-polarity body region, a heavily doped first-polarity region, a second-polarity grade region and a heavily doped second-polarity region. The heavily doped second-polarity region is surrounded by the second-polarity grade region. The second-polarity grade region is surrounded by the first-polarity body region. The second transistor includes a second drain structure, a second source structure, a second gate structure and a first-polarity drift region. The first-polarity drift region and the first-polarity body region have the same dopant concentration.

16 Claims, 4 Drawing Sheets

INTEGRATED CIRCUIT DEVICE

FIELD OF THE INVENTION

The present invention relates to an integrated circuit device, and more particularly to an integrated circuit device with two transistors with different operating voltages.

BACKGROUND OF THE INVENTION

Nowadays, the integration of different function circuit modules into the same semiconductor chip is gradually adopted in the manufacture of an integrated circuit. As known, these function circuit modules have respective operating voltage ranges. It is a challenge of integrating so many function circuit modules with different operating voltage ranges into the same semiconductor chip. In views of the device configurations, the function circuit modules with different operating voltage ranges are very distinguished. Since the current method of integrating these function circuit modules are difficult and complicated, the fabricating cost is increased and the production yield is unsatisfied. Therefore, there is a need of providing an improved transistor to obviate the above drawbacks.

SUMMARY OF THE INVENTION

In accordance with an aspect, the present invent provides an integrated circuit device. The integrated circuit device includes a semiconductor substrate and a first transistor and a second transistor constructed in the semiconductor substrate. The first transistor has a first operating voltage. The second transistor has a second operating voltage. The first operating voltage is higher than the second operating voltage.

The first transistor includes a first drain structure, a first source structure, an isolation structure and a first gate structure. The first drain structure is formed in the semiconductor substrate. The first source structure is formed in the semiconductor substrate, and includes a high voltage first-polarity well region, a first-polarity body region, a heavily doped first-polarity region, a second-polarity grade region and a heavily doped second-polarity region. The heavily doped second-polarity region is surrounded by the second-polarity grade region. The second-polarity grade region is surrounded by the first-polarity body region. The isolation structure is formed in the semiconductor substrate, and arranged between the first drain structure and the first source structure. The first gate structure is arranged between the first source structure and the first drain structure, and partially disposed over the isolation structure. The second transistor includes a second drain structure, a second source structure, a second gate structure and a first-polarity drift region. The second drain structure is formed in the semiconductor substrate. The second source structure is formed in the semiconductor substrate. The second gate structure formed in the semiconductor substrate, and arranged between the second source structure and the second drain structure. The first-polarity drift region is formed in the semiconductor substrate for at least surrounding the second drain structure. The first-polarity drift region and the first-polarity body region have the same dopant concentration.

In an embodiment, the semiconductor substrate is a silicon substrate, and the first transistor is a lateral insulated-gate bipolar transistor has an operating voltage up to 800V.

In an embodiment, the dopant concentrations of the high voltage first-polarity well region, the first-polarity body region, the heavily doped first-polarity region, the second-polarity grade region and the heavily doped second-polarity region of the first transistor are in the following scale level $10^{13}$ cm$^{-2}$, $10^{13}$ cm$^{-2}$, $10^{15}$ cm$^{-2}$, $10^{13}$ cm$^{-2}$ and $10^{15}$ cm$^{-2}$, respectively.

In an embodiment, the isolation structure is a multilayered structure including a field oxide layer and a silicon oxide layer, wherein the thickness of the silicon oxide layer is about 5000 angstroms, and the silicon oxide layer is formed by carrying out a low-pressure tetraethylorthosilicate chemical vapor deposition process.

In an embodiment, the first gate structure includes a gate dielectric layer and a segmented gate structure. The gate dielectric layer is arranged between the first drain structure and the first source structure. The segmented gate structure is formed on a surface of the gate dielectric layer.

In an embodiment, the integrated circuit device further includes a P-type top region, wherein a great portion of the P-type top region is located under the isolation structure, and only a small portion of the P-type top region extends in a direction toward the first source structure.

In an embodiment, the second transistor is an N-channel metal-oxide-semiconductor field-effect transistor with an operating voltage of 5V, wherein the first-polarity drift region is a P-type drift region, which is formed in the semiconductor substrate for surrounding the second drain structure and the second source structure.

In an embodiment, the second transistor is a P-channel metal-oxide-semiconductor field-effect transistor with an operating voltage of 30V, wherein the first-polarity drift region is a P-type drift region, which is formed in the semiconductor substrate for surrounding the second drain structure.

In accordance with an aspect, the present invent provides an integrated circuit device. The integrated circuit device includes a semiconductor substrate and a first transistor and a second transistor constructed in the semiconductor substrate. The first transistor has a first operating voltage. The second transistor has a second operating voltage. The first operating voltage is higher than the second operating voltage. The first transistor includes a first drain structure, a first source structure, an isolation structure and a first gate structure. The first drain structure is formed in the semiconductor substrate. The first source structure is formed in the semiconductor substrate, and comprising a high voltage first-polarity well region, a first-polarity body region, a heavily doped first-polarity region, a second-polarity grade region and a heavily doped second-polarity region. The heavily doped second-polarity region is surrounded by the second-polarity grade region. The second-polarity grade region is surrounded by the first-polarity body region. The isolation structure is formed in the semiconductor substrate, and arranged between the first drain structure and the first source structure. The first gate structure is arranged between the first source structure and the first drain structure, and partially disposed over the isolation structure. The second transistor includes a second drain structure, a second source structure, a second gate structure and a second-polarity drift region. The second drain structure is formed in the semiconductor substrate. The second source structure is formed in the semiconductor substrate. The second gate structure is formed in the semiconductor substrate, and arranged between the second source structure and the second drain structure. The second-polarity drift region is formed in the semiconductor substrate for at least surrounding the second drain structure. The second-polarity drift region and the second-polarity grade region have the same dopant concentration In an embodiment, the semiconductor substrate is a silicon substrate, and the first transistor is a lateral insulated-gate bipolar transistor has an operating voltage up to 800V.

In an embodiment, the dopant concentrations of the high voltage first-polarity well region, the first-polarity body region, the heavily doped first-polarity region, the second-polarity grade region and the heavily doped second-polarity region of the first transistor are in the following scale level $10^{13}$ cm$^{-2}$, $10^{13}$ cm$^{-2}$, $10^{15}$ cm$^{-2}$, $10^{13}$ cm$^{-2}$ and $10^{15}$ cm$^{-2}$, respectively.

In an embodiment, the isolation structure is a multilayered structure including a field oxide layer and a silicon oxide layer, wherein the thickness of the silicon oxide layer is about 5000 angstroms, and the silicon oxide layer is formed by carrying out a low-pressure tetraethylorthosilicate chemical vapor deposition process.

In an embodiment, the first gate structure includes a gate dielectric layer and a segmented gate structure. The gate dielectric layer is arranged between the first drain structure and the first source structure. The segmented gate structure is formed on a surface of the gate dielectric layer.

In an embodiment, the integrated circuit device further includes a P-type top region, wherein a great portion of the P-type top region is located under the isolation structure, and only a small portion of the P-type top region extends in a direction toward the first source structure.

In an embodiment, the second transistor is a P-channel metal-oxide-semiconductor field-effect transistor with an operating voltage of 5V, wherein the second-polarity drift region is an N-type drift region, which is formed in the semiconductor substrate for surrounding the second drain structure and the second source structure.

In an embodiment, the second transistor is an N-channel metal-oxide-semiconductor field-effect transistor with an operating voltage of 30V, wherein the second-polarity drift region is an N-type drift region, which is formed in the semiconductor substrate for surrounding the second drain structure.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A~1F are schematic cross-sectional views illustrating various metal-oxide-semiconductor field-effect transistors to be fabricated on the same semiconductor chip.

Figure 1A:
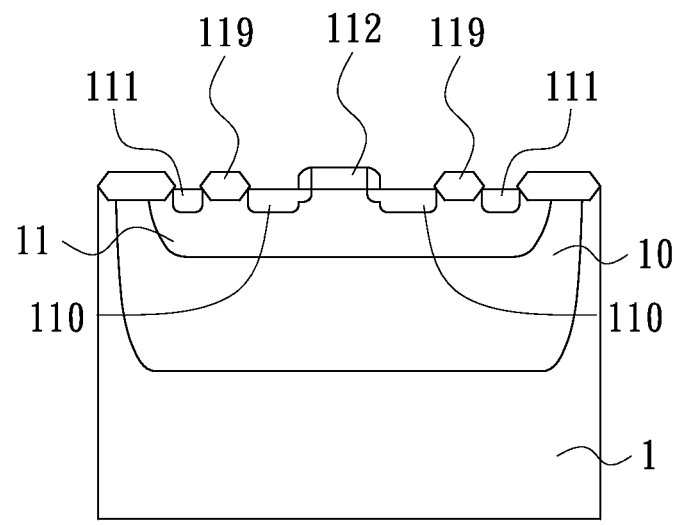
FIGS. 1A~1F are schematic cross-sectional views illustrating various metal-oxide-semiconductor field-effect transistors to be fabricated on the same semiconductor chip.

In FIG. 1A, a P-channel metal-oxide-semiconductor field-effect transistor with an operating voltage of 5V is shown. This P-channel metal-oxide-semiconductor field-effect transistor (also referred as 5V PMOS transistor) is constructed in a P-type substrate 1. The P-type substrate 1 has a deep N-well (DNW) region 10. Then, an N-drift (ND) region 11 is formed in the deep N-well region 10. Then, a heavily P-doped (P+) region 110 and a heavily N-doped (N+) region 111 are formed in the N-drift region 11, and a gate structure 112 is formed over the N-drift region 11. The heavily P-doped region 110 is served as a source/drain region. The heavily N-doped region 111 is served as a body region. The dopant concentration of the heavily N-doped region 111 is higher than the dopant concentration of the N-drift region 11. In addition, the heavily P-doped region 110 and the heavily N-doped region 111 are isolated from each other by an isolation structure 119.

Figure 1B:
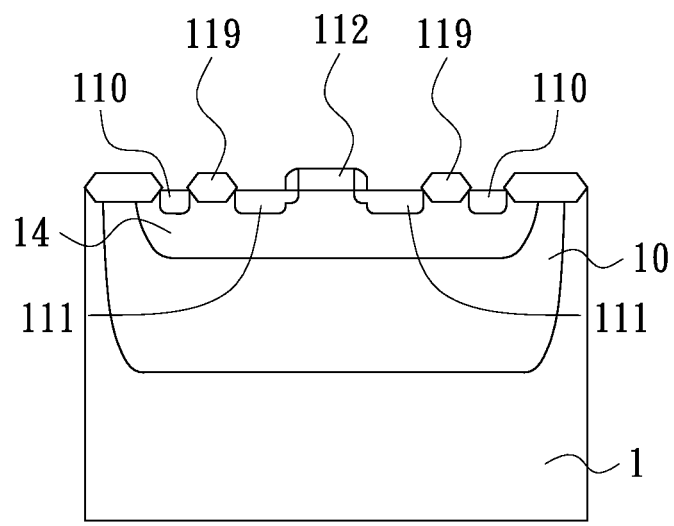

In FIG. 1B, an N-channel metal-oxide-semiconductor field-effect transistor with an operating voltage of 5V is shown. This N-channel metal-oxide-semiconductor field-effect transistor (also referred as 5V NMOS transistor) is also constructed in a P-type substrate 1. The P-type substrate 1 has a deep N-well (DNW) region 10. Then, a P-drift (PD) region 14 is formed in the deep N-well region 10. Then, a heavily P-doped (P+) region 110 and a heavily N-doped (N+) region 111 are formed in the P-drift region 14, and a gate structure 112 is formed over the P-drift region 14. The heavily P-doped region 110 is served as a body region. The heavily N-doped region 111 is served as a source/drain region. The dopant concentration of the heavily P-doped region 110 is higher than the dopant concentration of the P-drift region 14. In addition, the heavily P-doped region 110 and the heavily N-doped region 111 are isolated from each other by an isolation structure 119.

Figure 1C:
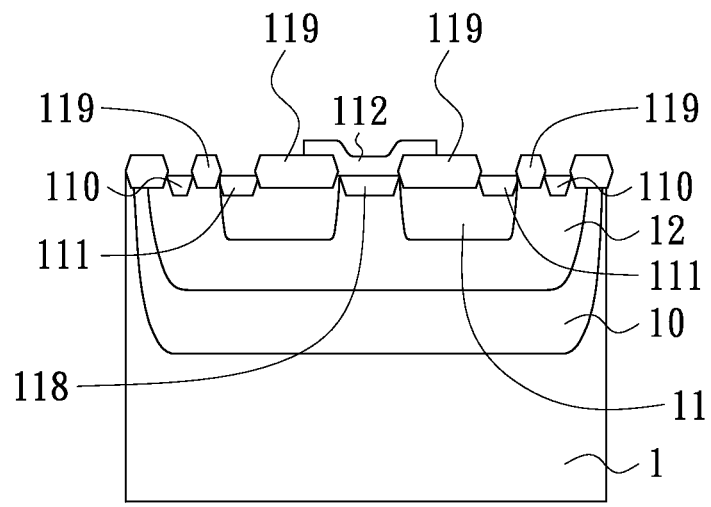

In FIG. 1C, an isolated high voltage N-channel metal-oxide-semiconductor field-effect transistor with an operating voltage of 30V is shown. This isolated high voltage N-channel metal-oxide-semiconductor field-effect transistor (also referred as 30V ISO-NMOS transistor) is also constructed in a P-type substrate 1. The P-type substrate 1 has a deep N-well (DNW) region 10. Then, a high voltage P-well (HVPW) region 12 is formed in the deep N-well region 10. Similarly, an N-drift (ND) region 11, a heavily N-doped region 111 and a heavily P-doped region 110 are formed in the high voltage P-well region 12 to be served as the source/drain region and the body region, respectively. In addition, the heavily P-doped region 110 and the heavily N-doped region 111 are isolated from each other by an isolation structure 119. A gate structure 112 is formed on the isolation structure 119 and a channel region 118, wherein the channel region 118 is implemented by another high voltage P-well region 12.

Figure 1D:
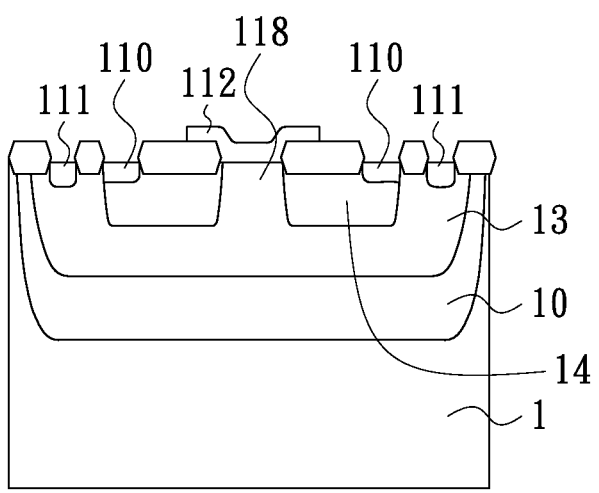

In FIG. 1D, an isolated high voltage P-channel metal-oxide-semiconductor field-effect transistor with an operating voltage of 30V is shown. This isolated high voltage P-channel metal-oxide-semiconductor field-effect transistor (also referred as 30V ISO-PMOS transistor) is also constructed in a P-type substrate 1. The P-type substrate 1 has a deep N-well (DNW) region 10. Then, a high voltage N-well (HVNW) region 13 is formed in the deep N-well region 10.

Then, a P-drift (PD) region 14, a heavily N-doped region 111 and a heavily P-doped region 110 are formed in the high voltage P-well region 12 to be served as the source/drain region and the body region, respectively. In addition, the heavily P-doped region 110 and the heavily N-doped region 111 are isolated from each other by an isolation structure 119. Similarly, a gate structure 112 is formed on the isolation structure 119 and a channel region 118, wherein the channel region 118 is also implemented by the high voltage N-well region 13.

Figure 1E:
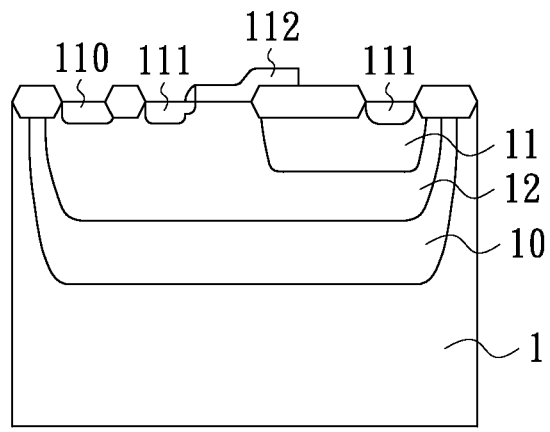
Figure 1F:
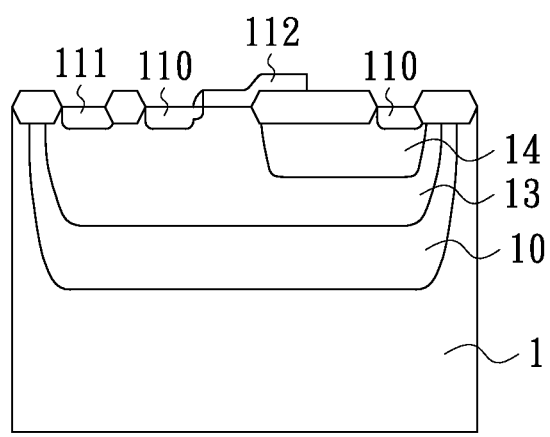

The 30V ISO-NMOS transistor and the 30V ISO-PMOS transistor as shown in FIGS. 1C and 1D are symmetric devices. As shown in FIGS. 1E and 1F, the 30V ISO-NMOS transistor and the 30V ISO-PMOS transistor are asymmetric devices. In FIG. 1F, an asymmetric is shown. These asymmetric devices are also constructed in a P-type substrate 1. The configurations of the transistors shown in FIGS. 1E and 1F are similar to those of FIGS. 1C and 1D, and are not redundantly described herein.

In the various metal-oxide-semiconductor field-effect transistors as shown in FIGS. 1A~1F, the main components include the P-type substrate 1, the deep N-well region 10, the N-drift region 11, the heavily P-doped region 110, the heavily N-doped region 111, the gate structure 112, the P-drift region 14, the high voltage P-well region 12, the isolation structure 119 and the high voltage N-well region 13. In this embodiment, the gate structure 112 is a multilayered structure with at least a gate dielectric layer and a gate conductor layer. For clarification and brevity, the multilayered structure is not shown.

Figure 2:
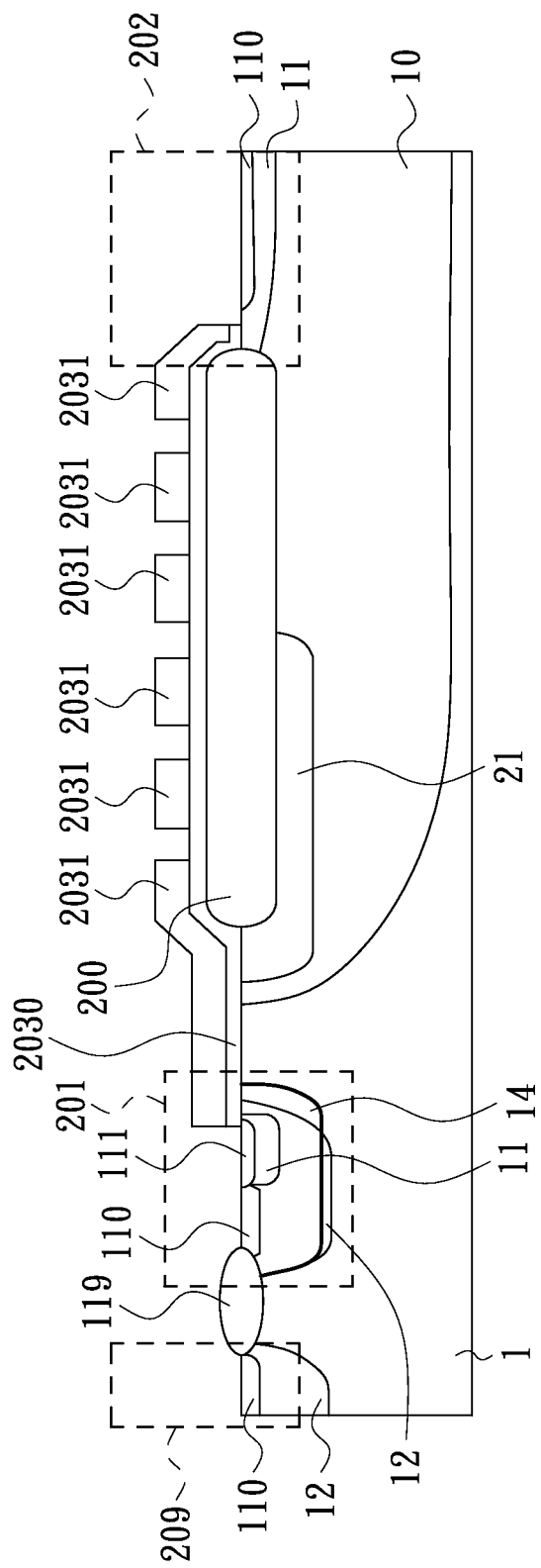
FIG. 2 is a schematic cross-sectional view illustrating a lateral insulated-gate bipolar transistor (LIGBT) according to an embodiment of the present invention.

FIG. 2 is a schematic cross-sectional view illustrating a lateral insulated-gate bipolar transistor (LIGBT) according to an embodiment of the present invention. The lateral insulated-gate bipolar transistor has an operating voltage up to 800V. In the lateral insulated-gate bipolar transistor, three types of transistors with operating voltages 5V, 30V and 800V are simultaneously constructed in the same substrate without increasing the numbers of the photo masks and the ion implantation steps. That is, the N-grade (NG) region and the P-body region used in the conventional lateral insulated-gate bipolar transistor are replaced by the N-drift region 11 and the P-drift region 14. Likewise, the lateral insulated-gate bipolar transistor of the present invention is constructed in a P-type substrate 1. In additions, isolation structures 119 and 200 are formed over the P-type substrate 1. A source structure 201 and a body region 209 are isolated from each other by the isolation structure 119. The isolation structure 200 is arranged between the source structure 201 and the drain structure 202. Like the isolation structure 119 as shown in FIGS. 1A~1F, the isolation structure 119 of FIG. 2 is a field oxide layer. In addition, the isolation structure 200 is a multilayered structure including a field oxide layer and a silicon oxide layer, wherein the thickness of the silicon oxide layer is about 5000 angstroms. In an embodiment, the 5000-angstrom silicon oxide layer is formed by carrying out a low-pressure tetraethylorthosilicate chemical vapor deposition (LP-TEOS CVD) process. Moreover, a segmented gate structure 2031 and a consecutive gate dielectric layer 2030 are arranged between the source structure 201 and the drain structure 202 and stretched over the isolation structure 200. The segmented gate structure 203 may be simultaneously fabricated with the gate structure 112 as shown in FIGS. 1A~1F.

Similarly, the P-type substrate 1 has a deep N-well (DNW) region 10. Then, a P-type top (P_TOP) region 21 is formed in the deep N-well region 10. A great portion of the P-type top region 21 is located under the isolation structure 200, and only a small portion of the P-type top region 21 extends in the direction toward the source structure 201. The drain structure 202 comprises an N-drift (ND) region 11 and a heavily P-doped region 110. The body region 209 is also implemented by another heavily P-doped region 110. Moreover, the heavily P-doped region 110 of the heavily P-doped region 110 is surrounded by a high voltage P-well (HVPW) region 12.

Please refer to FIG. 2 again. The source structure 201 comprises a high voltage P-well (HVPW) region 12, a P-drift (PD) region 14, a heavily P-doped region 110, an N-drift (ND) region 11 and a heavily N-doped (N+) region 111. The heavily N-doped (N+) region 111 is surrounded by the N-drift region 11. That is, the N-grade (NG) region used in the conventional lateral insulated-gate bipolar transistor is replaced by the N-drift region 11. Moreover, the P-body region used in the conventional lateral insulated-gate bipolar transistor is replaced by the P-drift (PD) region 14.

In the lateral insulated-gate bipolar transistor of FIG. 2, the N-type dopant concentrations comply with the following relationship: N+($10^{15}$ cm$^{-2}$)>ND ($10^{13}$ cm$^{-2}$)>DNW ($10^{12}$ cm$^{-2}$); and the P-type dopant dosages comply with the following relationship: P+($10^{15}$ cm$^{-2}$)>PD & HNPW ($10^{13}$ cm$^{-2}$)>P_TOP ($10^{12}$ cm$^{-2}$).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated circuit device comprising a semiconductor substrate and a first transistor and a second transistor constructed in the semiconductor substrate, the first transistor having a first operating voltage, the second transistor having a second operating voltage, the first operating voltage is higher than the second operating voltage, wherein the first transistor comprises:
a first drain structure formed in the semiconductor substrate;
a first source structure formed in the semiconductor substrate, and comprising a high voltage first-polarity well region, a first-polarity body region, a heavily doped first-polarity region, a second-polarity grade region and a heavily doped second-polarity region, wherein the heavily doped second-polarity region is surrounded by the second-polarity grade region, and the second-polarity grade region is surrounded by the first-polarity body region;
an isolation structure formed in the semiconductor substrate, and arranged between the first drain structure and the first source structure; and
a first gate structure arranged between the first source structure and the first drain structure, and partially disposed over the isolation structure, wherein the second transistor comprises:
a second drain structure formed in the semiconductor substrate;
a second source structure formed in the semiconductor substrate;
a second gate structure formed in the semiconductor substrate, and arranged between the second source structure and the second drain structure; and
a first-polarity drift region formed in the semiconductor substrate for at least surrounding the second drain structure, wherein the first-polarity drift region and the first-polarity body region have the same dopant concentration.

2. The integrated circuit device according to claim 1, wherein the semiconductor substrate is a silicon substrate, and the first transistor is a lateral insulated-gate bipolar transistor has an operating voltage up to 800V.

3. The integrated circuit device according to claim 1, wherein the dopant concentrations of the high voltage first-polarity well region, the first-polarity body region, the heavily doped first-polarity region, the second-polarity grade region and the heavily doped second-polarity region of the first transistor are in the following scale level $10^{13}$ cm$^{-2}$, $10^{13}$ cm$^{-2}$, $10^{15}$ cm$^{-2}$, $10^{13}$ cm$^{-2}$ and $10^{15}$ cm$^{-2}$, respectively.

4. The integrated circuit device according to claim 1, wherein the isolation structure is a multilayered structure including a field oxide layer and a silicon oxide layer, wherein the thickness of the silicon oxide layer is about 5000 angstroms, and the silicon oxide layer is formed by carrying out a low-pressure tetraethylorthosilicate chemical vapor deposition process.

5. The integrated circuit device according to claim 1, wherein the first gate structure comprises:
 a gate dielectric layer arranged between the first drain structure and the first source structure; and
 a segmented gate structure formed on a surface of the gate dielectric layer.

6. The integrated circuit device according to claim 1 further comprising a P-type top region, wherein a great portion of the P-type top region is located under the isolation structure, and only a small portion of the P-type top region extends in a direction toward the first source structure.

7. The integrated circuit device according to claim 1, wherein the second transistor is an N-channel metal-oxide-semiconductor field-effect transistor with an operating voltage of 5V, wherein the first-polarity drift region is a P-type drift region, which is formed in the semiconductor substrate for surrounding the second drain structure and the second source structure.

8. The integrated circuit device according to claim 1, wherein the second transistor is a P-channel metal-oxide-semiconductor field-effect transistor with an operating voltage of 30V, wherein the first-polarity drift region is a P-type drift region, which is formed in the semiconductor substrate for surrounding the second drain structure.

9. An integrated circuit device comprising a semiconductor substrate and a first transistor and a second transistor constructed in the semiconductor substrate, the first transistor having a first operating voltage, the second transistor having a second operating voltage, the first operating voltage is higher than the second operating voltage,
 wherein the first transistor comprises:
  a first drain structure formed in the semiconductor substrate;
  a first source structure formed in the semiconductor substrate, and comprising a high voltage first-polarity well region, a first-polarity body region, a heavily doped first-polarity region, a second-polarity grade region and a heavily doped second-polarity region, wherein the heavily doped second-polarity region is surrounded by the second-polarity grade region, and the second-polarity grade region is surrounded by the first-polarity body region;
  an isolation structure formed in the semiconductor substrate, and arranged between the first drain structure and the first source structure; and
  a first gate structure arranged between the first source structure and the first drain structure, and partially disposed over the isolation structure, wherein the second transistor comprises:
  a second drain structure formed in the semiconductor substrate;
  a second source structure formed in the semiconductor substrate;
  a second gate structure formed in the semiconductor substrate, and arranged between the second source structure and the second drain structure; and
  a second-polarity drift region formed in the semiconductor substrate for at least surrounding the second drain structure, wherein the second-polarity drift region and the second-polarity grade region have the same dopant concentration.

10. The integrated circuit device according to claim 9, wherein the semiconductor substrate is a silicon substrate, and the first transistor is a lateral insulated-gate bipolar transistor has an operating voltage up to 800V.

11. The integrated circuit device according to claim 9, wherein the dopant concentrations of the high voltage first-polarity well region, the first-polarity body region, the heavily doped first-polarity region, the second-polarity grade region and the heavily doped second-polarity region of the first transistor are in the following level $10^{13}$ cm$^{-2}$, $10^{13}$ cm$^{-2}$, $10^{15}$ cm$^{-2}$, $10^{13}$ cm$^{-2}$ and $10^{15}$ cm$^{-2}$, respectively.

12. The integrated circuit device according to claim 9, wherein the isolation structure is a multilayered structure including a field oxide layer and a silicon oxide layer, wherein the thickness of the silicon oxide layer is about 5000 angstroms, and the silicon oxide layer is formed by carrying out a low-pressure tetraethylorthosilicate chemical vapor deposition process.

13. The integrated circuit device according to claim 9, wherein the first gate structure comprises:
 a gate dielectric layer arranged between the first drain structure and the first source structure; and
 a segmented gate structure formed on a surface of the gate dielectric layer.

14. The integrated circuit device according to claim 9 further comprising a P-type top region, wherein a great portion of the P-type top region is located under the isolation structure, and only a small portion of the P-type top region extends in a direction toward the first source structure.

15. The integrated circuit device according to claim 9, wherein the second transistor is a P-channel metal-oxide-semiconductor field-effect transistor with an operating voltage of 5V, wherein the second-polarity drift region is an N-type drift region, which is formed in the semiconductor substrate for surrounding the second drain structure and the second source structure.

16. The integrated circuit device according to claim 9, wherein the second transistor is an N-channel metal-oxide-semiconductor field-effect transistor with an operating voltage of 30V, wherein the second-polarity drift region is an N-type drift region, which is formed in the semiconductor substrate for surrounding the second drain structure.

* * * * *